(12) United States Patent
Grivna

(10) Patent No.: US 6,803,317 B2
(45) Date of Patent: Oct. 12, 2004

(54) METHOD OF MAKING A VERTICAL GATE SEMICONDUCTOR DEVICE

(75) Inventor: Gordon M. Grivna, Mesa, AZ (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 267 days.

(21) Appl. No.: 10/219,167

(22) Filed: Aug. 16, 2002

(65) Prior Publication Data

US 2004/0033694 A1 Feb. 19, 2004

(51) Int. Cl.[7] ............................................. H01L 21/311
(52) U.S. Cl. ...................... 438/694; 438/201; 438/700; 438/723
(58) Field of Search ............................ 438/201, 694, 438/700, 703, 706, 710, 723, 724

(56) References Cited

U.S. PATENT DOCUMENTS

| | | | | |
|---|---|---|---|---|
| 5,016,067 A | * | 5/1991 | Mori | ........................... 257/330 |
| 5,455,792 A | * | 10/1995 | Yi | ........................... 365/185.15 |
| 5,719,067 A | * | 2/1998 | Gardner et al. | ............. 438/270 |
| 5,891,782 A | * | 4/1999 | Hsu et al. | .................... 438/302 |
| 6,051,456 A | | 4/2000 | Davies et al. | |
| 6,110,783 A | | 8/2000 | Burr | |
| 6,153,905 A | | 11/2000 | Davies et al. | |
| 6,197,640 B1 | | 3/2001 | Davies et al. | |
| 6,506,638 B1 | * | 1/2003 | Yu | .............................. 438/156 |

* cited by examiner

Primary Examiner—Kin-Chan Chen
(74) Attorney, Agent, or Firm—James J. Stipanuk (57) ABSTRACT

A method of making a semiconductor device (10) includes depositing a first conductive layer (50) on a first surface (41) to control a channel (70) of the semiconductor device at a second surface (40) perpendicular to the first surface. The method further includes etching a first dielectric film (32) to form a gap (53) between the first surface and a control electrode (68) of the semiconductor device, and depositing a conductive material (56) in the gap to electrically connect the first conductive layer to the control electrode.

20 Claims, 11 Drawing Sheets

METHOD OF MAKING A VERTICAL GATE SEMICONDUCTOR DEVICE

BACKGROUND OF THE INVENTION

The present invention relates in general to semiconductor devices and, more particularly, to vertical gate transistors.

There is a continuing demand for semiconductor devices with a higher level of performance and a lower manufacturing cost. For example, manufacturers of switching regulators are demanding more efficient power MOSFET transistors for switching the inductor currents that develop the regulated output voltages. Higher efficiency is achieved by utilizing transistors with shorter channels to provide a higher frequency response to reduce the regulators' switching losses.

However, most previous high frequency power transistors require advanced photolithographic equipment capable of resolving small feature sizes in order to provide the shorter length channels necessary to reduce switching losses. Other high frequency transistors are formed with vertical gate structures in which the channel lengths are defined by the thickness of a deposited gate electrode rather than a feature size of a photolithographic tool. This approach reduces the need for costly photolithographic equipment and reduces the cost of building the devices. However, existing vertical gate devices require numerous masking steps and a complex sequence of processing steps, which results in a low die yield and high manufacturing cost.

Hence, there is a need for a semiconductor device with a short channel for efficient high frequency operation that can be made with a simple sequence of processing steps and lower cost manufacturing tools.

DETAILED DESCRIPTION OF THE DRAWINGS

In the figures, elements having the same reference number have similar functionality.

Figure 1:
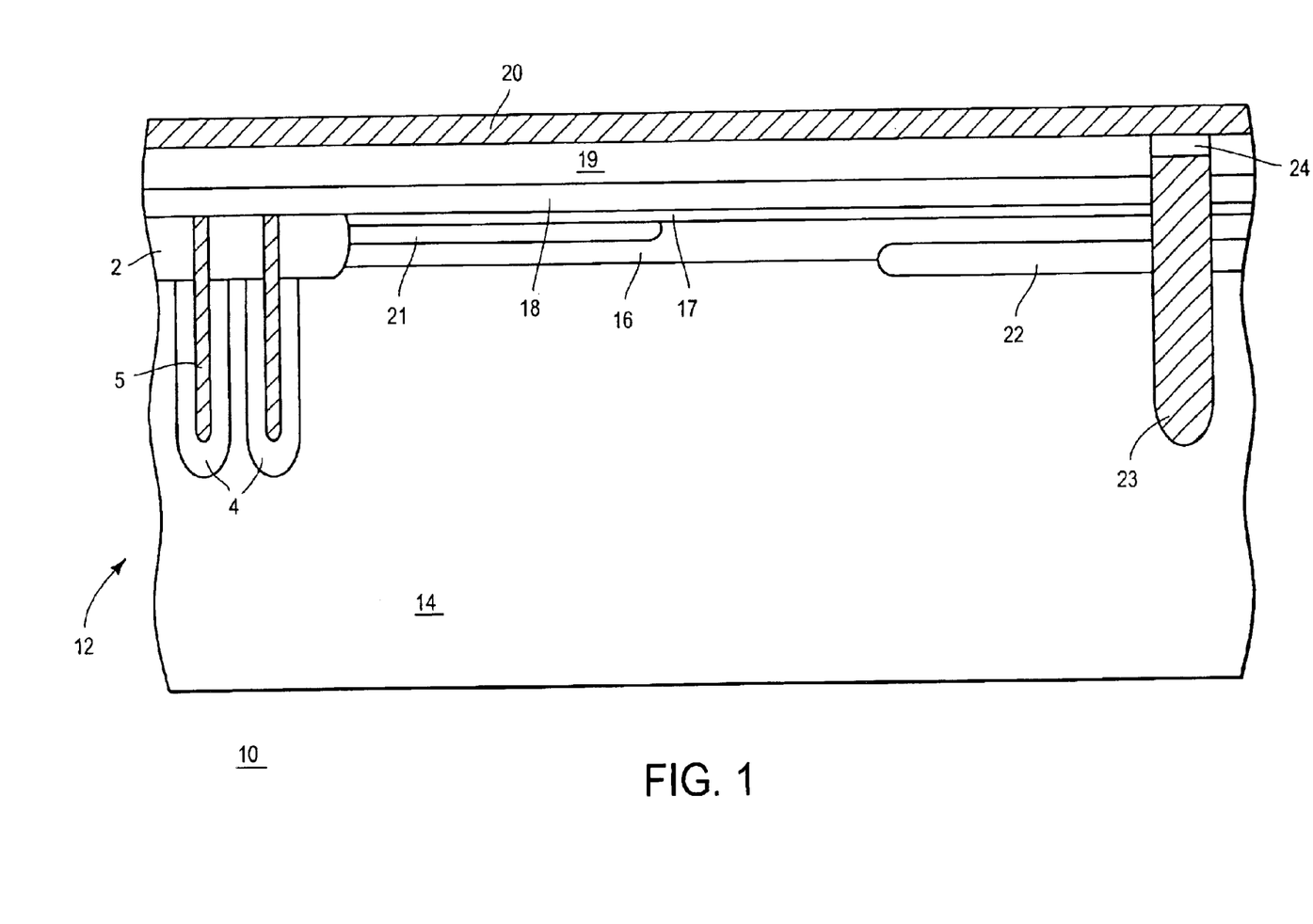
FIG. 1 is a cross-sectional view of an semiconductor device after a first fabrication stage.

FIG. 1 is a cross-sectional view of a semiconductor device 10 formed with a semiconductor substrate 12 after a first processing stage. In one embodiment, semiconductor device 10 is formed with a plurality of active and passive components to function as an integrated circuit.

A base layer 14 is formed to have a thickness of about two hundred fifty micrometers. In one embodiment, base layer 14 is heavily doped to have a p-type conductivity and a resistivity of about 0.01 ohm-centimeters to function as a ground plane for semiconductor device 10. An upper portion of base layer 14 may include a p-type epitaxial region with a thickness between about six and seven micrometers and a resistivity between about two and three ohm-centimeters. In one embodiment, base layer 14 comprises monocrystalline silicon.

An epitaxial layer 16 is grown to a thickness between about 0.5 and 0.7 micrometers over base layer 14. In one embodiment, epitaxial layer 16 comprises monocrystalline silicon doped to have an n-type conductivity and a doping concentration between about $1.0*10^{16}$ and about $1.5*10^{16}$ atoms/centimeter$^3$.

A dielectric layer 17 is formed over epitaxial layer 16 to a thickness of about seven hundred angstroms. In one embodiment, dielectric layer 17 is formed with a thermally grown silicon dioxide.

Substrate 12 is masked and subjected to a series of etching steps to form a shallow isolation region that is filled with a dielectric material 2 such as silicon dioxide. A further masking step and series of etches are used to optionally form an array of deep trenches which are then lined with a dielectric material 4 and filled with a semiconductor material 5 as shown. Semiconductor material 5 may be removed later in the fabrication cycle to form air gaps that result in a low permittivity region suitable for forming high frequency passive components and/or bonding pads (not shown). Alternatively, semiconductor material 5 may be oxidized along with semiconductor material between the deep trenches to form a continuous region of low permittivity silicon dioxide. In one embodiment, dielectric material 4 comprises silicon dioxide and semiconductor material 5 comprises polycrystalline silicon.

A photolithographic mask is used to pattern substrate 12 to mask an implant step that introduces n-type dopants into substrate 12 to form a lightly-doped drain (LDD) region 21. Another photolithographic mask is followed by another implant step to introduce p-type dopants into substrate 12 to form a heavily doped body enhancement region 22 as shown.

A blanket dielectric layer 18 is formed over dielectric layer 17 to a thickness of about one thousand five hundred angstroms. In one embodiment, dielectric layer 18 comprises deposited silicon nitride.

A blanket dielectric layer 19 is formed over dielectric layer 18 to a thickness of about eight thousand angstroms. In one embodiment, dielectric layer 19 comprises deposited silicon dioxide.

A deep trench is etched and filled with a doped semiconductor material to form a substrate contact 23. In one embodiment, substrate contact 23 is formed with heavily doped p-type polycrystalline silicon to provide a low resistance electrical connection to body enhancement region 22 and base layer 14. The semiconductor material in substrate contact 23 is then thermally oxidized to form a dielectric cap 24.

A semiconductor layer 20 is formed over dielectric layer 19 to a thickness of about eight thousand angstroms. In one embodiment, semiconductor layer 20 comprises heavily doped polycrystalline silicon.

Figure 2:
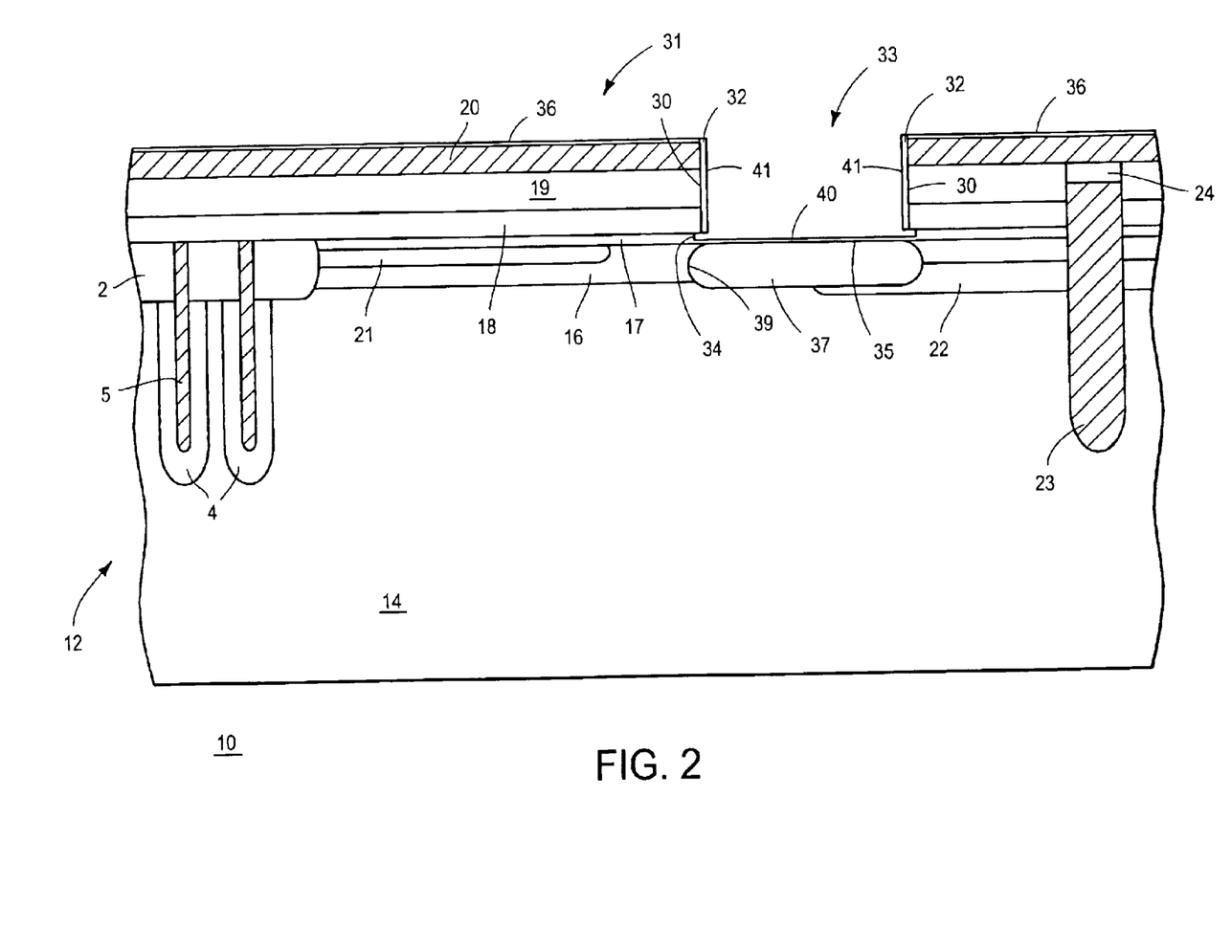
FIG. 2 is a cross-sectional view of the semiconductor device after the second fabrication stage.

FIG. 2 is a cross-sectional view of semiconductor device 10 after a second processing stage.

A photomask (not shown) is applied over semiconductor layer 20 for selectively etching semiconductor layer 20 and dielectric layer 19 to form a recessed region 33 in substrate 12 whose width is defined by vertical surfaces 30. A wet nitride etch is then applied to remove portions of dielectric layer 18 within recessed region 33. Note that vertical surfaces 30 are formed to be substantially perpendicular to a surface 40 of substrate 12 to define a raised pedestal structure 31 as shown. In one embodiment, recessed region 33 has a width between about 2.8 and about 3.6 micrometers. In an alternate embodiment, the photomask and etch steps may also be used to form an opening over LDD region 21 to form a self-aligned drain contact. Such a structure would reduce the die area occupied by semiconductor device 10 and therefore its fabrication cost.

A dielectric material is conformally deposited on substrate 12 to a thickness of about eight hundred angstroms and then anisotropically etched to form dielectric spacers 32 along vertical surfaces 30. In one embodiment, dielectric spacers 32 are formed with silicon nitride.

A silicon dioxide wet etch is applied to remove portions of dielectric layer 17 that lie within recessed region 33. The etch is prolonged in order to undercut or remove material from dielectric layer 17 that lies under spacers 32 to form a recessed vertical surface 34. Recessing dielectric layer 17 in this fashion ensures that a channel (not shown) formed in body region 37 extends into epitaxial layer 16 in order to allow channel current to flow, as well as increasing both the operating voltage and the output impedance of semiconductor device 10 by increasing its channel length. In one embodiment, surface 34 is recessed from vertical surfaces 41 of dielectric spacers 32 by a distance of about 0.1 micrometers.

A p-type implant is then applied to substrate 12. Dopants are blocked by dielectric spacers 32 to produce a body region 37 whose boundaries 39 are defined by vertical surfaces 41. Body region 37 has a doping concentration suitable for forming an inversion layer that operates as a conduction channel of semiconductor device 10 as described below.

A thermal oxide is grown on surface 40 within recessed region 33 to a thickness of about one hundred fifty angstroms to form a gate dielectric 35. This thermal oxidation step also produces a thin oxide layer 36 on exposed surfaces of semiconductor layer 20.

Figure 3:
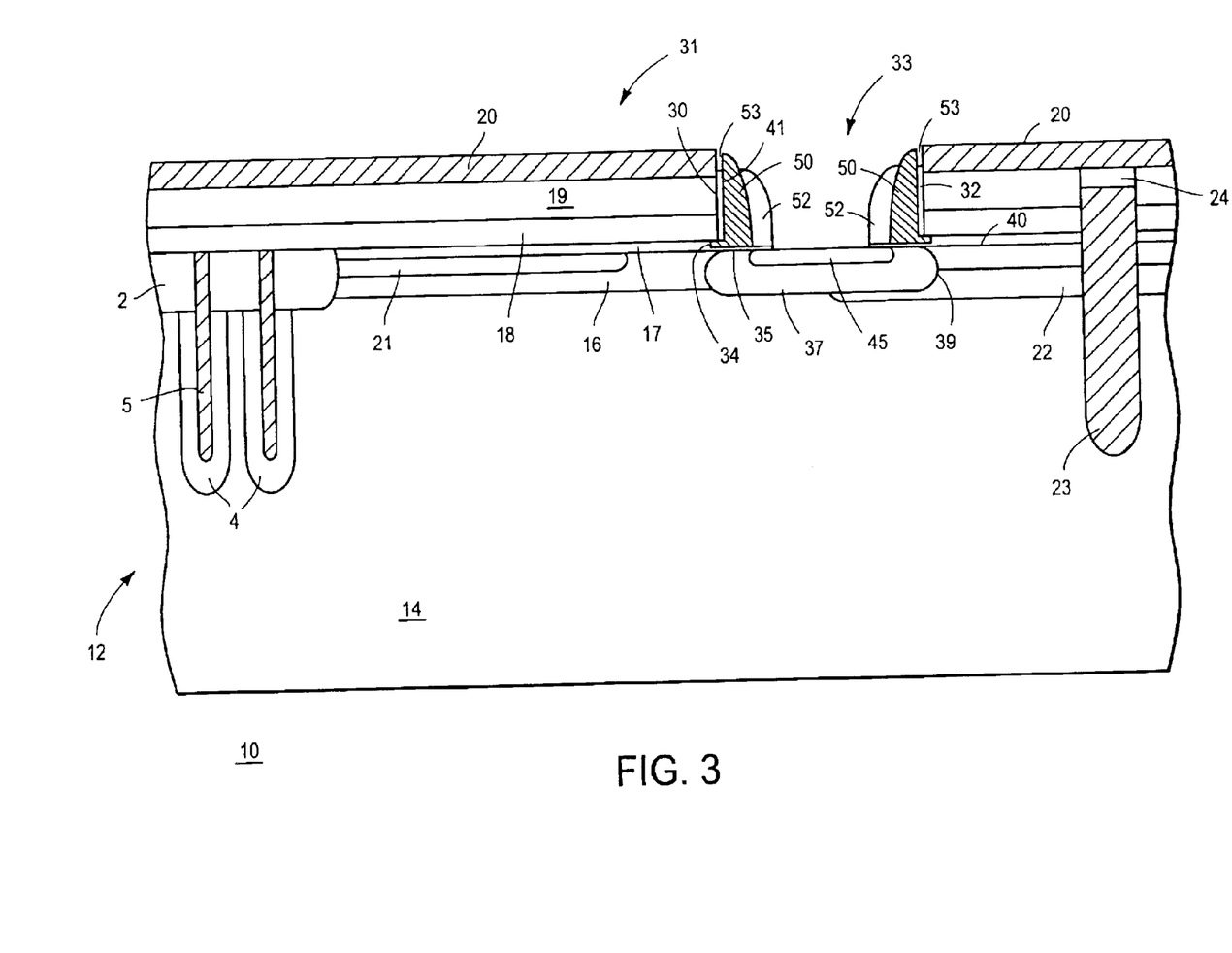
FIG. 3 is a cross-sectional view of the semiconductor device after a third fabrication stage.

FIG. 3 shows a cross-sectional view of semiconductor device 10 after a third fabrication stage. A layer of semiconductor material is conformally deposited to a thickness of about three thousand angstroms. An endpointed anisotropic etch is applied to remove a predetermined thickness of semiconductor material to form semiconductor spacers along vertical surfaces 41 that are designated as vertical gates 50. In some applications, device performance may be improved by using an additional photomask step to remove one of the vertical gates, preferably the one lying nearer substrate contact 23. Vertical gates 50 are used to mask an implant or diffusion step that defines a source region 45 within body region 37 as shown.

The deposited film thickness of vertical gates 50 effectively establishes the length of a channel formed along surface 40 between source region 45 and epitaxial layer 16. Since the film thickness is well controlled and much less than the minimum feature size of the photolithographic tool used to pattern semiconductor device 10, a high performance device can be built using relatively inexpensive equipment.

Note that a bipolar transistor with vertical gates 50 functioning as base electrodes can be formed by omitting the etch step that recesses dielectric layer 19 and etching dielectric layer 18 to form vertical gate 50 directly on body region 37. By doping vertical gates 50 to have the same conductivity type as body region 37, an ohmic connection between vertical gates 50 and body region 37 is formed to operate as a base of the bipolar transistor. Subsequent processing is as described below, with the source and drain operating as the emitter and collector, respectively, of the bipolar device.

A dielectric material is then deposited to a thickness of about six thousand angstroms and anisotropically etched to form dielectric spacers 52 adjacent to vertical gates 50. In one embodiment, dielectric spacers 52 are formed with deposited silicon dioxide. In this embodiment, the anisotropic etch step also clears silicon dioxide from exposed portions of surface 40 within recessed region 33 and from exposed surfaces of semiconductor layer 20.

A timed wet etch is then applied to remove a portion of material from dielectric spacers 32 to form a gap 53 between vertical gate 50 and semiconductor layer 20.

Figure 4:
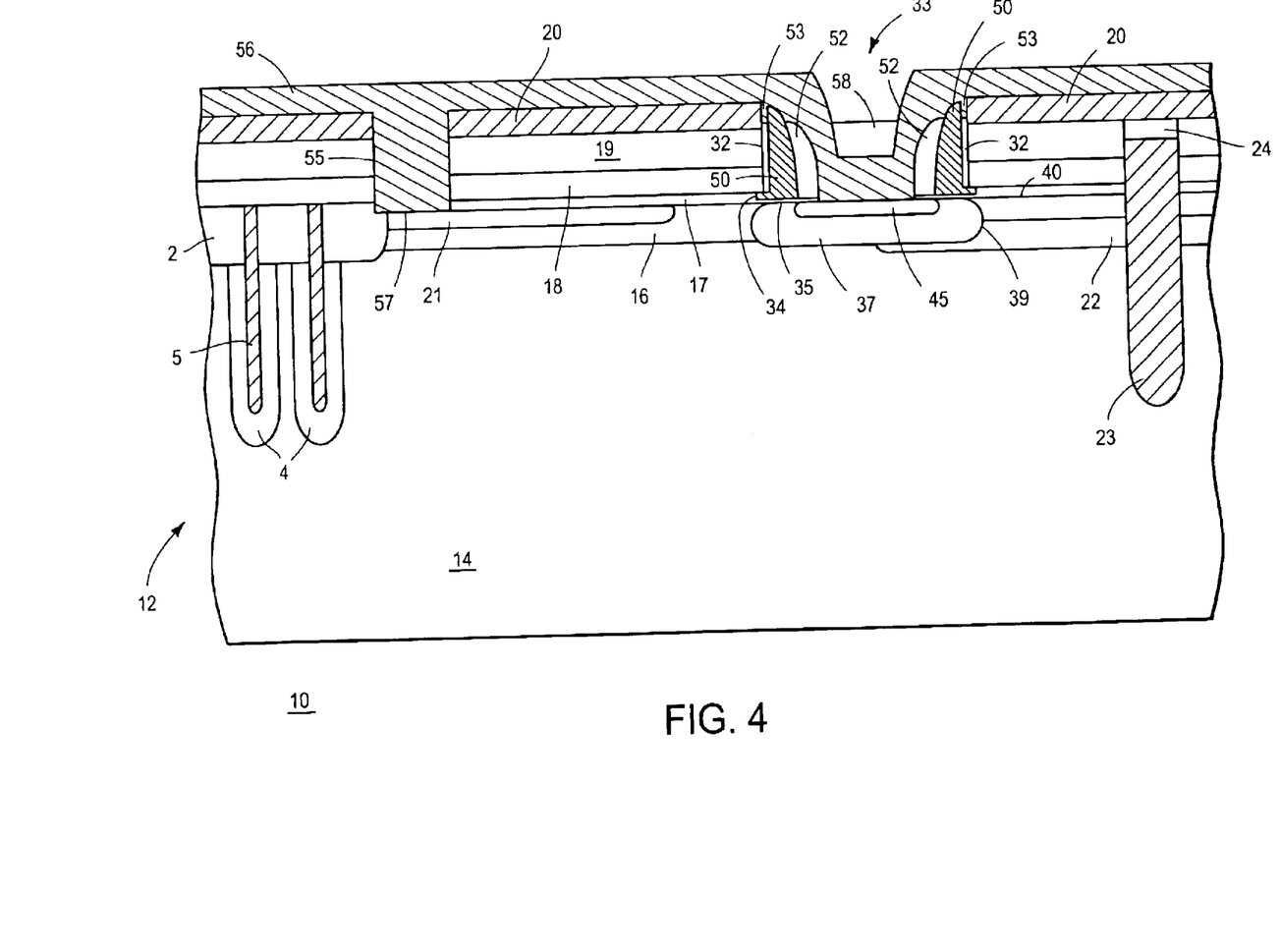
FIG. 4 is a cross-sectional view of the semiconductor device after a fourth fabrication stage.

FIG. 4 shows a cross-sectional view of semiconductor device 10 after a fourth fabrication stage. A standard photoresist layer is applied and patterned to mask a series of etch steps that successively remove material from semiconductor layer 20 and dielectric layers 19, 18 and 17 to form an opening 55 that exposes a region of surface 40 that functions as a drain contact 57.

A semiconductor layer 56 is deposited with a thickness of about six thousand angstroms to fill opening 55 and coat the surfaces of semiconductor layer 20 and recessed region 33 as shown. Semiconductor layer 56 electrically contacts LDD region 21 at drain contact 57. In one embodiment, semiconductor layer 56 comprises polycrystalline silicon. Alternatively, semiconductor layer 56 may be formed with a thickness just adequate to fill gap 53, after which a thermal oxidation step completely oxidizes the remaining portions of semiconductor layer 56. As yet a further alternative, semiconductor layer 56 is omitted entirely. Instead, a layer of a conductive material such as titanium or platinum is deposited to fill gap 53 to form a low resistance silicide layer on surfaces of semiconductor layer 20 for local interconnections. An etch step is then used to remove the conductive material from non-semiconductor surfaces where a silicide is not formed.

A photoresist layer is applied to a thickness of about six thousand angstroms, but is not patterned. Recessed region 33 is relatively narrow, so the photoresist layer is thicker within recessed region 33 than over other surfaces. Consequently, an endpoint photoresist etch to remove more than the six thousand angstroms of deposited photoresist material leaves a plug 58 over semiconductor layer 56 within recessed region 33.

Figure 5:
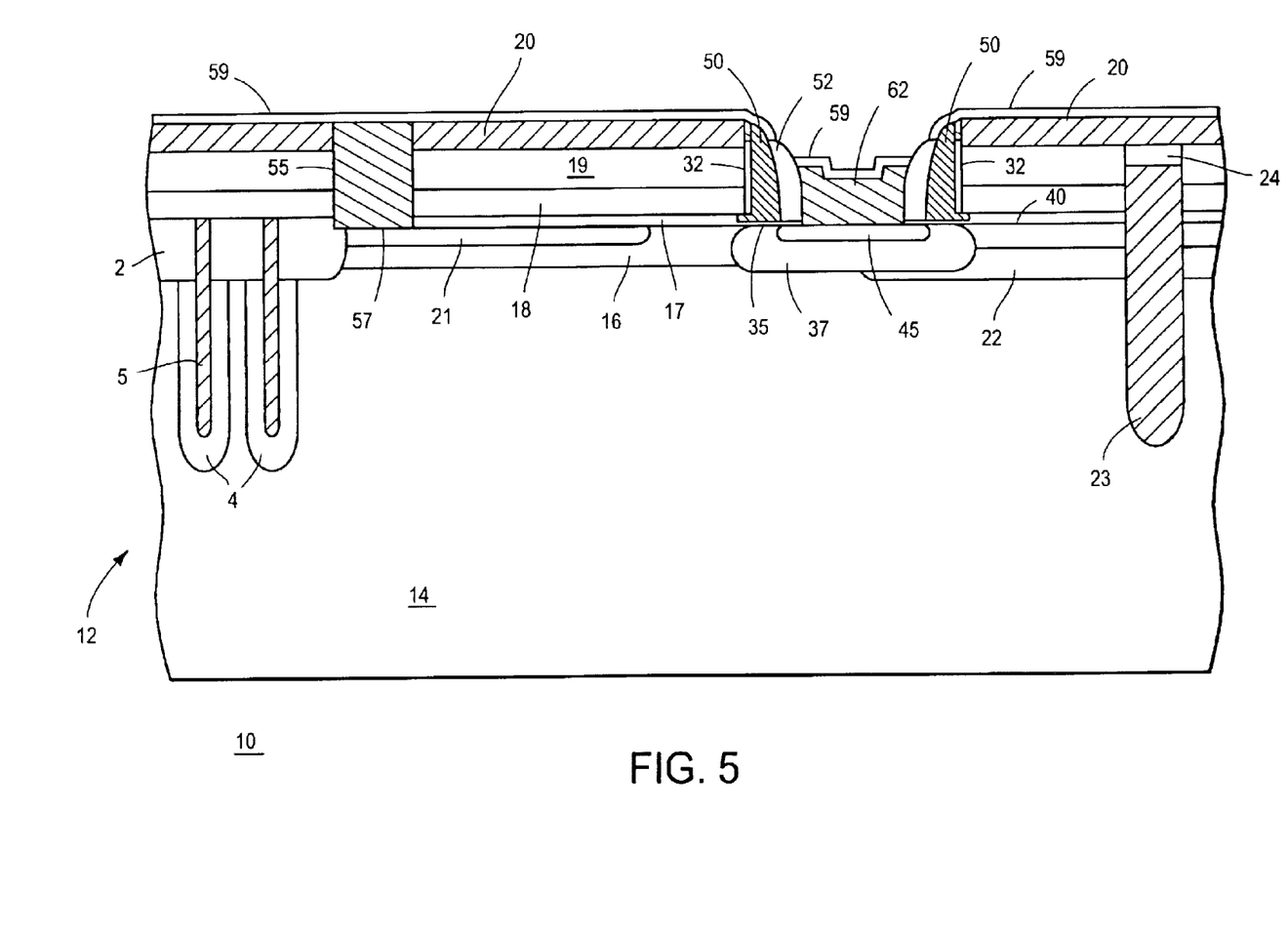
FIG. 5 is a top view of the semiconductor device after a fifth fabrication stage.

FIG. 5 shows a cross-sectional view of semiconductor device 10 after a fifth fabrication stage. A timed isotropic semiconductor etch removes portions of semiconductor layer 56 outside of recessed region 33, and plug 58 is removed to leave a source electrode 62 for making electrical contact to source region 45. A blanket implant is performed to dope semiconductor layer 20 and source electrode 62. In one embodiment, the blanket implant introduces a high concentration of n-type dopants to produce low resistance films in semiconductor layer 20 and source electrode 62. The implant step is followed by a thermal oxide step that produces a silicon dioxide film 59 over exposed semiconductor material. In one embodiment, the thermal oxide step produces silicon dioxide film 59 with a thickness of about three hundred angstroms.

Figure 6:
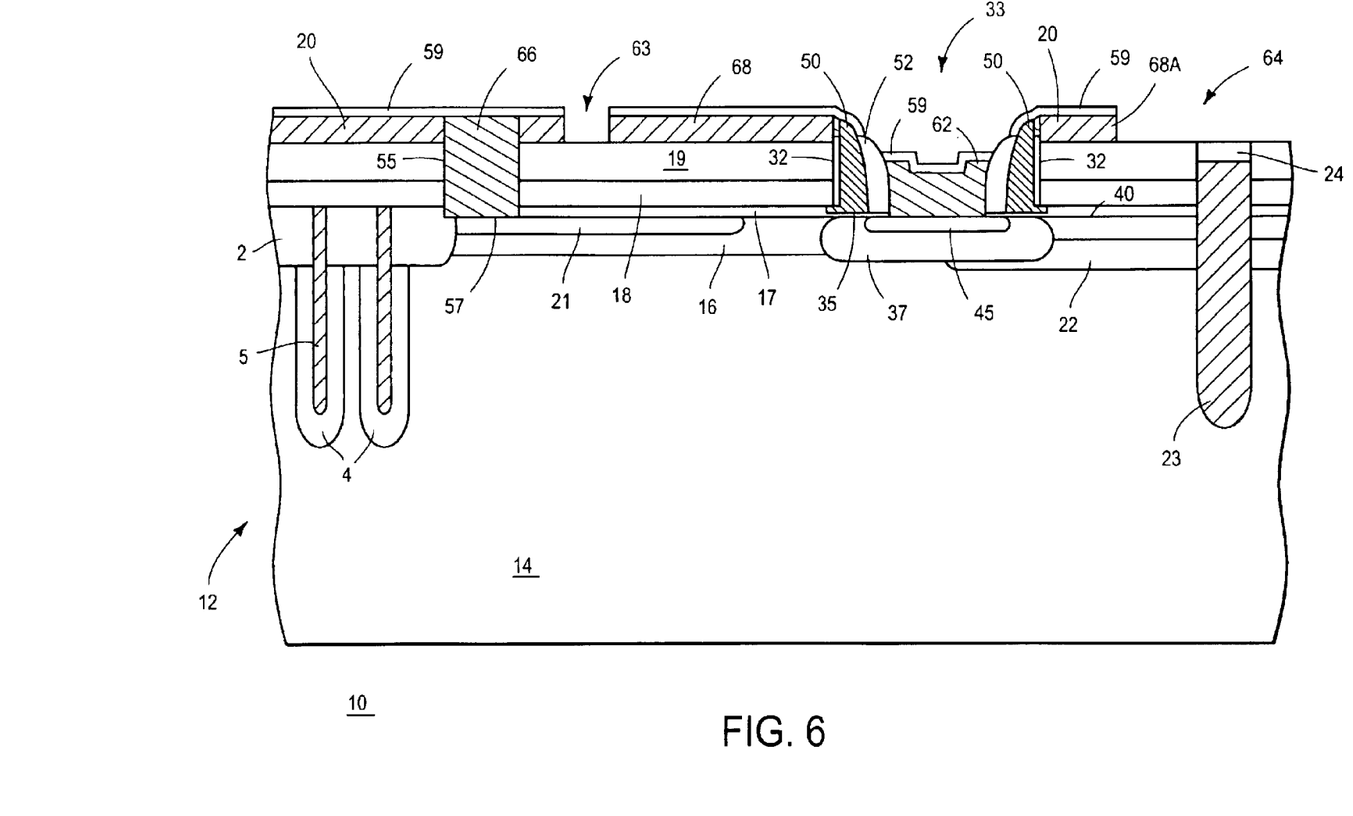
FIG. 6 is a cross-sectional view of the semiconductor device after a sixth fabrication stage.

FIG. 6 shows a cross-sectional view of semiconductor device 10 after a sixth fabrication stage. A photomask patterns electrodes of semiconductor device 10, followed by silicon dioxide and polysilicon etches to remove material from silicon dioxide film 59 and semiconductor layer 20 in a region 63 to isolate a drain electrode 66 from a gate electrode 68. The etch steps also remove material in a region 64 to isolate an associated gate electrode 68A from other components (not shown) formed on substrate 12. In one embodiment, gate electrode 68 and associated gate electrode 68A are electrically connected out of the view plane of FIG. 6 in order to reduce the on resistance of semiconductor device 10. In an alternate embodiment, associated gate electrode 68A is removed.

Figure 7:
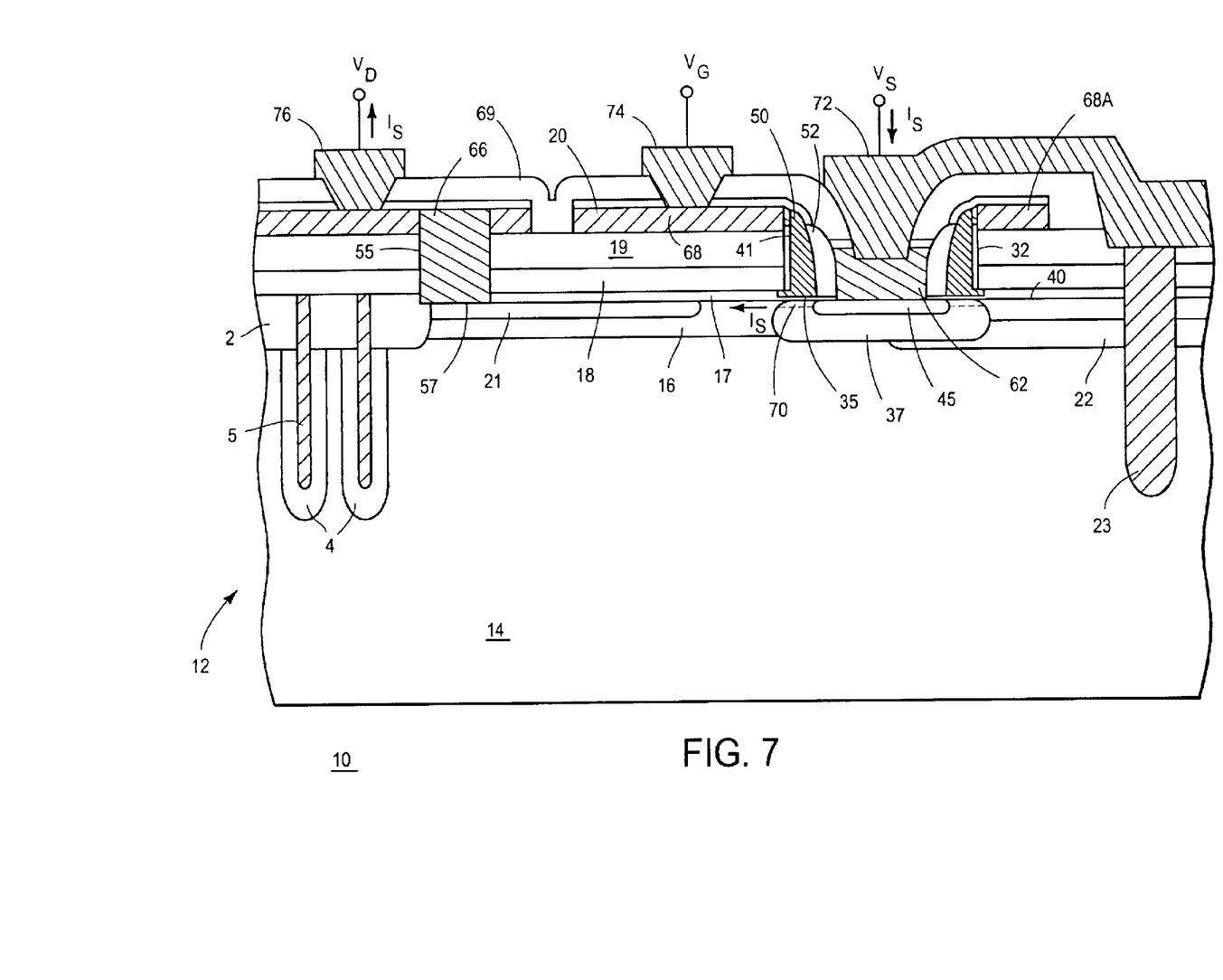
FIG. 7 is a cross-sectional view of the semiconductor device after a seventh fabrication stage.

FIG. 7 shows a cross-sectional view of semiconductor device 10 after a seventh fabrication stage.

An interlayer dielectric film 69 is formed on substrate 12. In one embodiment, dielectric film 69 comprises silicon dioxide deposited to a thickness of about six thousand angstroms. Dielectric film 69 is then patterned and subjected to an isotropic and an anisotropic etch to form contact openings to source electrode 62, drain electrode 66 and gate electrode 68.

A standard metallization layer is deposited and then patterned and etched to produce a source terminal 72 coupled to source electrode 62, a gate terminal 74 coupled to vertical gate 50 through gate electrode 68, and a drain terminal 76 coupled to drain electrode 66 to produce a functional device that may be connected to internal and/or external components.

The operation of semiconductor device 10 proceeds as follows. Assume that source terminal 72 is operating at a potential $V_S$ of zero volts, gate terminal 74 receives a control voltage $V_G$=2.5 volts which is greater than the conduction threshold of semiconductor device 10, and drain terminal 76 operates at a drain potential $V_D$=5.0 volts. The values of $V_G$ and $V_S$ cause body region 37 to invert under vertical gate 50 to form a channel 70 to electrically connect source region 45 to epitaxial layer 16. A device current Is flows from source terminal 72 and is routed through source electrode 62, source region 45, channel 70, epitaxial region 16, LDD region 21 and drain electrode 66 to drain terminal 76. Hence, current $I_S$ flows vertically through substrate 12 to produce a low on resistance. In one embodiment, $I_S$=1.0 amperes.

Note that the length of channel 70 is determined by the thickness of the film used to form vertical gates 50. A vertical gate refers to a control electrode formed with a gate material deposited on one surface to control a channel formed on another perpendicular surface. In the case of semiconductor device 10, channels 70 are formed at a surface 40, which is considered a horizontal surface. The control electrode film is deposited along vertical surfaces 41, which run perpendicular to surface 40. As a result, the channel length is determined by the thickness of the vertical gate 50 film. Hence, a control signal applied to vertical gates 50 causes body region 37 to invert at surface 40 to form channels 70 with a length about equal to the thickness of vertical gates 50.

Figure 8:
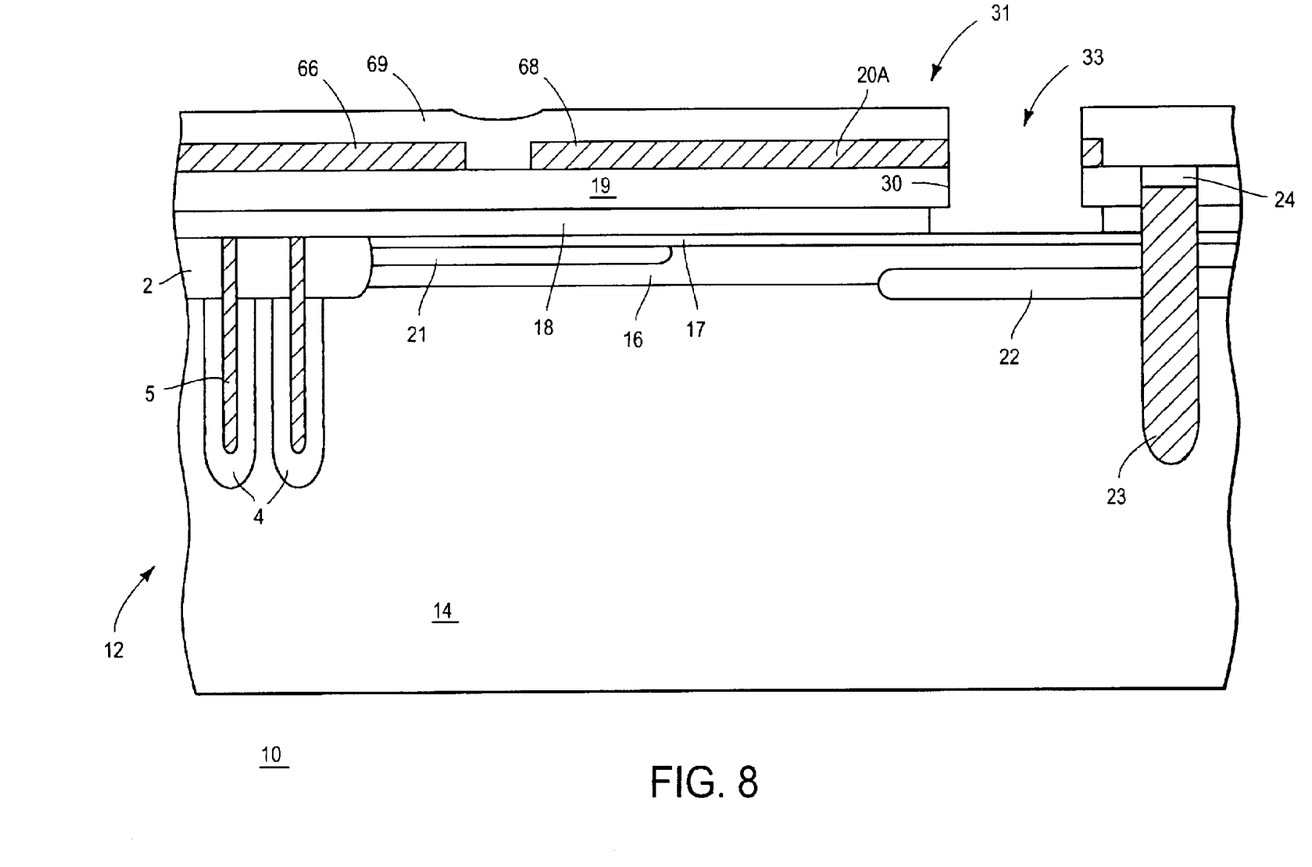
FIG. 8 is a cross-sectional view of an alternate embodiment of the semiconductor device after a first fabrication stage.

FIG. 8 is a cross-sectional view of semiconductor device 10 at an alternate first fabrication stage. In this embodiment, elements of the structure are similar to those described previously. A conductive material is deposited on dielectric layer 19 to form a conductive layer 20A. In one embodiment, conductive layer 20A is formed with a semiconductor material such as polycrystalline silicon deposited to a thickness of about one thousand eight hundred angstroms. Alternatively, the conductive material may be a lower resistance silicide material such as tungsten, titanium or their suicides. Conductive layer 20A is patterned and etched to form a drain electrode 66 and a gate electrode 68.

Interlayer dielectric film 69 is deposited to a thickness of about six thousand angstroms and etched to form recessed region 33 and pedestal 31. In one embodiment, dielectric film 69 is formed with a deposited silicon dioxide.

A wet nitride etch is applied to dielectric layer 18 to remove material from recessed region 33. This etch step may result in undercutting dielectric layer 18 to recess the layer under vertical surface 30.

Vertical surfaces 30 of pedestal 31 are used to mask a p-type implant into recessed region 33 to form body region 37.

Figure 9:
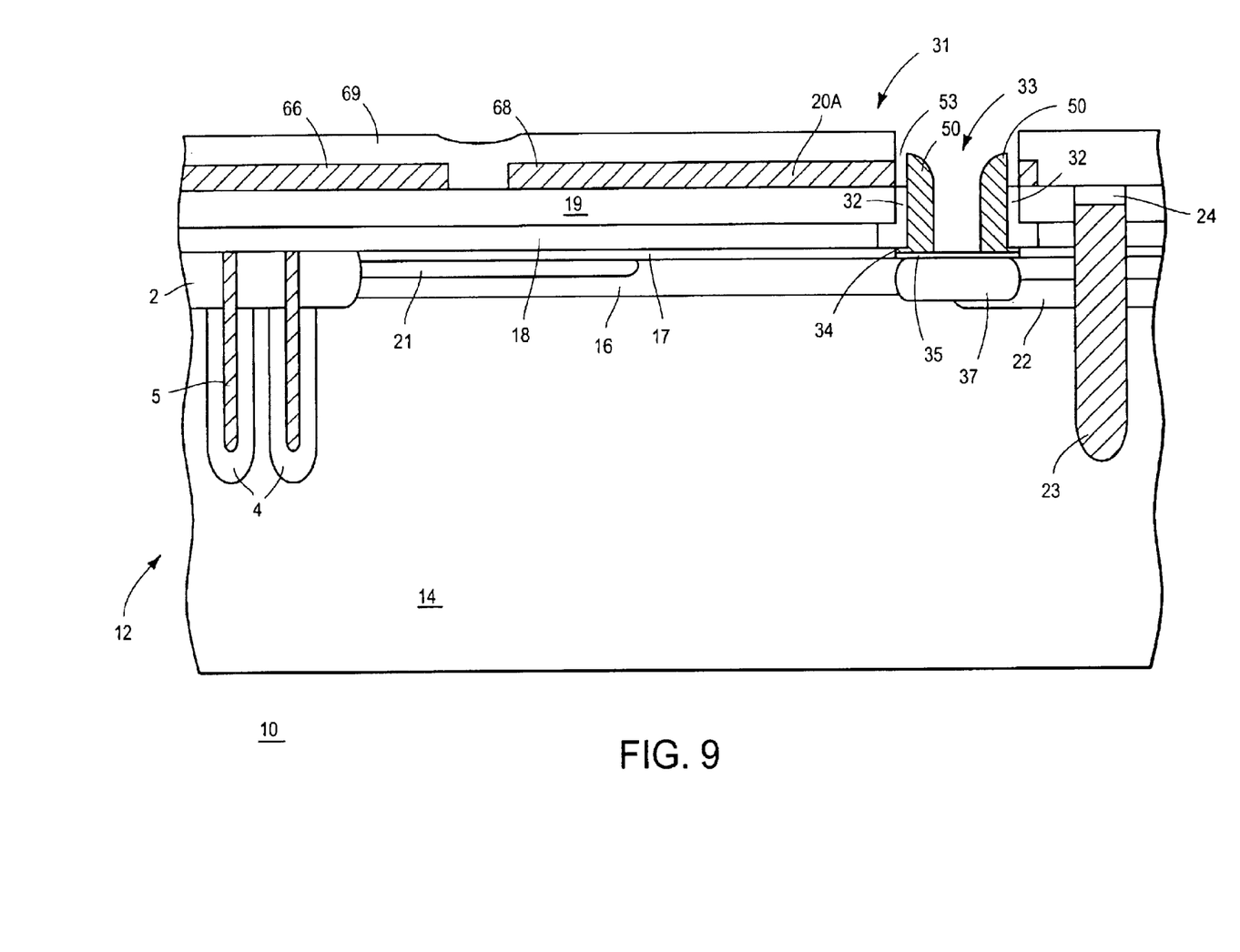
FIG. 9 is a cross-sectional view of the alternate embodiment of the semiconductor device after a second fabrication stage.

FIG. 9 is a cross-sectional view of semiconductor device 10 at an alternate second fabrication stage.

Dielectric material is deposited and anisotropically etched to form dielectric spacers 32 as shown.

Dielectric layer 17 is wet etched to remove material within recessed region 33 to form recessed vertical surface 34. Gate dielectric layer 35 is formed using a thermal oxidation step.

Semiconductor material is then deposited to a thickness of about three thousand angstroms. A blanket n-type implant is applied to dope exposed semiconductor surfaces and an anisotropic etch is used to form vertical gates 50. In one embodiment, vertical gates 50 are etched so that their height is about 0.3–0.4 micrometers below the top surface of spacers 32.

A nitride etch is used to remove a portion of dielectric spacers 32 to form gap 53 between vertical gates 50 and gate electrode 68.

Figure 10:
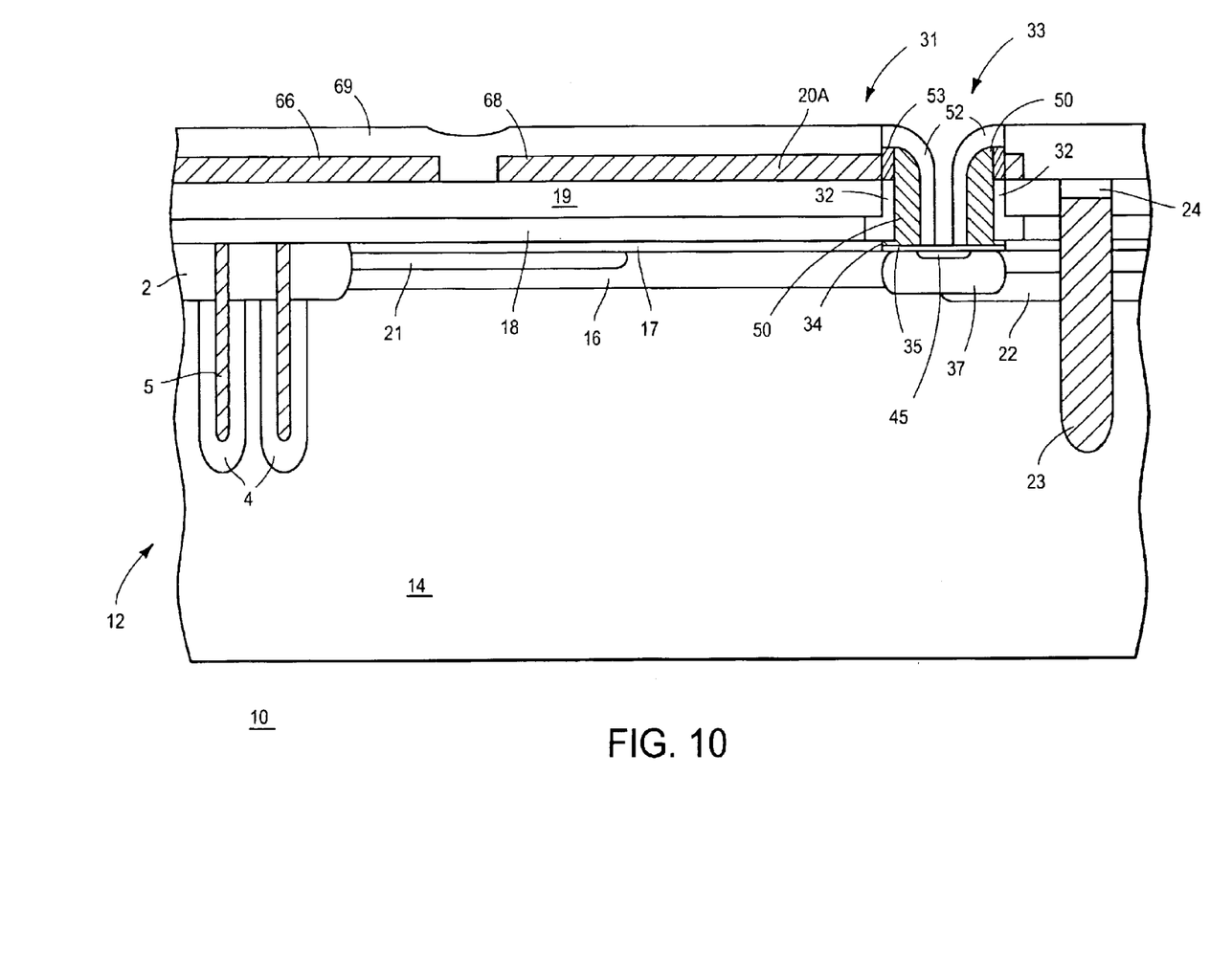
FIG. 10 is a cross-sectional view of the alternate embodiment of the semiconductor device after a third fabrication stage.

FIG. 10 shows a cross-sectional view of semiconductor device 10 at an alternate third fabrication stage.

A thin polysilicon layer is deposited to a thickness of about five hundred angstroms and thermally oxidized to form a polysilicon plug that fills gaps 53 to electrically connect vertical gates 50 to gate electrode 68.

Substrate 12 is then subjected to a blanket n-type implant that forms source region 45 whose boundaries are defined by, or self-aligned to, vertical gates 50.

A dielectric material is applied to a thickness of about six thousand angstroms and anisotropically etched to form dielectric spacers 52.

Figure 11:
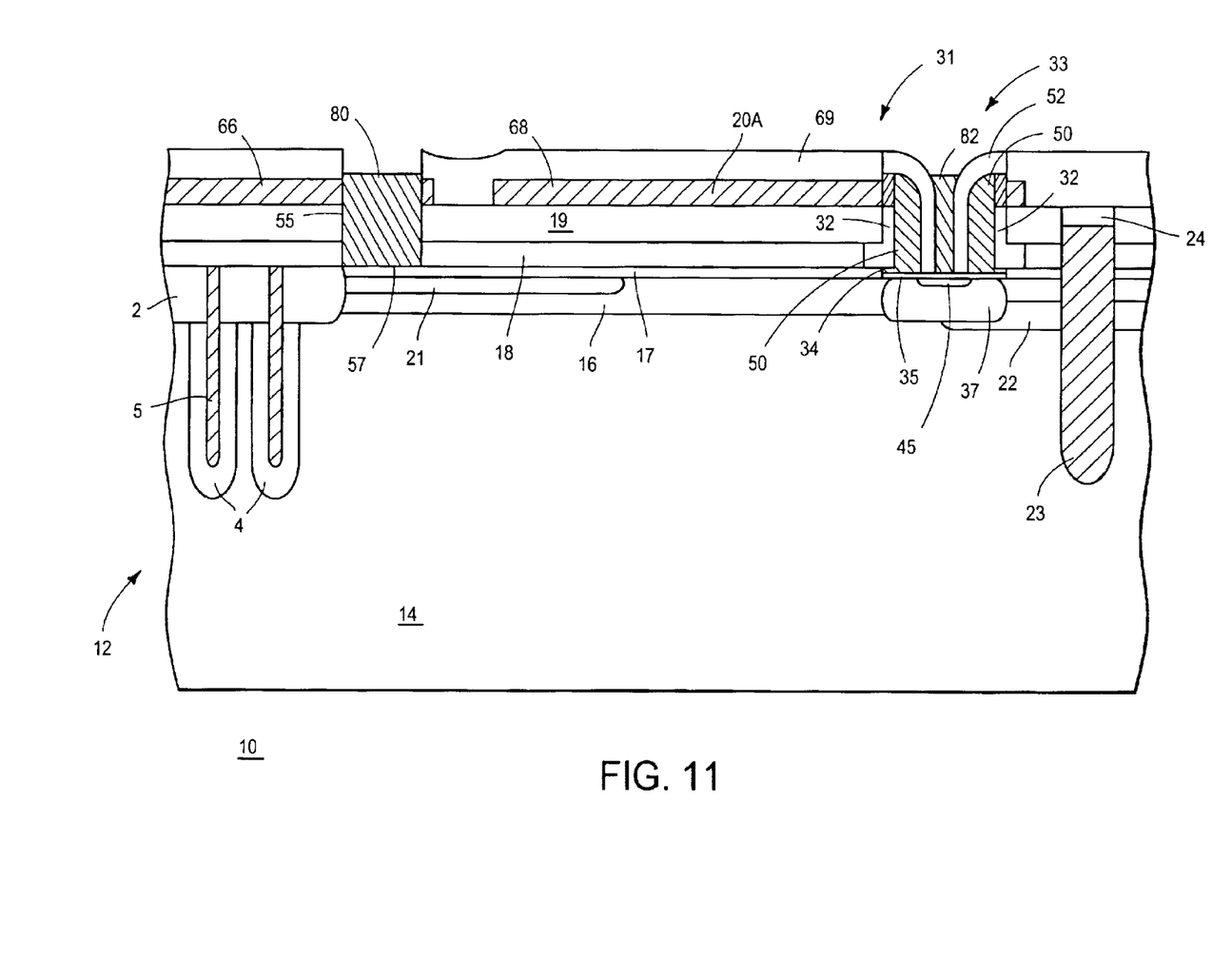
FIG. 11 is a cross-sectional view of the alternate embodiment of the semiconductor device after a fourth fabrication stage.

FIG. 11 shows a cross-sectional view of semiconductor device 10 at an alternate fourth fabrication stage. A photomask (not shown) patterns semiconductor device 10 and a series of etch steps forms opening 55 that is filled with a conductive material such as polysilicon to form a drain 80 for electrically connecting LDD region 21 at drain contact 57. The same steps fill recessed region with the conductive material to form a source 82 for electrically connecting to source region 45.

Note that the described process results in a highly planar device that is easily fabricated using standard semiconductor materials. The planarity facilitates the addition of one or more thin layers of metal interconnect to form electrical connections to standard planar metal-oxide-semiconductor or bipolar transistors or other types of electrical components to form an integrated circuit. Details of the subsequent metallization and interlayer dielectric processing will not be discussed further as it is similar to what was described previously.

In summary, the short channel device provided by the present method has a channel shorter than the feature size attainable with the photolithographic tools used to fabricate it. The method results in a low cost, high performance device that is suitable for integrating with other circuitry to produce an integrated circuit. A conductive layer is deposited on a first surface to control a channel at a second surface perpendicular to the first surface. A dielectric film is etched to form a gap between the first surface and a control terminal of the semiconductor device, and a conductive material is deposited in the gap to electrically connect the conductive layer to the control terminal.

What is claimed is:

1. A method of making a semiconductor device, comprising the steps of:
   depositing a first conductive layer on a first surface to control a channel of the semiconductor device at a second surface perpendicular to the first surface;
   etching a first dielectric film to form a gap between the first surface and a control electrode of the semiconductor device; and
   depositing a conductive material in the gap to electrically connect the first conductive layer to the control electrode.

2. The method of claim 1, further comprising the step of forming a body region at the second surface of a semiconductor substrate to provide the channel.

3. The method of claim 2, further comprising the step of depositing a second conductive layer on the semiconductor substrate to form the control electrode.

4. The method of claim 3, further comprising the steps of:
   depositing a second dielectric film over the second surface adjacent to the first surface; and
   depositing a third dielectric film on the second dielectric film adjacent to the first surface.

5. The method of claim 4, wherein the step of depositing the second conductive layer includes depositing polycrystalline silicon over the third dielectric film to produce the control electrode.

6. The method of claim 5, further including the steps of:
   etching the second dielectric film to form a first vertical surface parallel to the first surface;
   etching the third dielectric film to form a second vertical surface that is substantially coplanar with the first vertical surface; and
   etching the second conductive layer to form a third vertical surface that is substantially coplanar with the first and second vertical surfaces.

7. The method of claim 6, further comprising the step of depositing the first dielectric film over the first, second and third surfaces.

8. The method of claim 1, further comprising the step of depositing the first dielectric film along the first surface before the step of depositing the first conductive layer.

9. The method of claim 8, wherein the step of etching the first dielectric film includes the step of anisotropically etching silicon nitride.

10. A method of making a semiconductor device, comprising the steps of:
    etching a first conductive material to form a vertical gate along a vertical surface to control a channel along a horizontal surface of a semiconductor substrate;
    etching a dielectric spacer to form a gap between the vertical gate and a control electrode of the semiconductor device; and
    disposing a second conductive material in the gap to electrically connect the vertical gate to the control electrode.

11. The method of claim 10, further comprising the step of anisotropically etching a dielectric film to produce the dielectric spacer and the vertical surface.

12. The method of claim 11, further comprising the step of blocking dopants with the dielectric spacer to define a body region that supports the channel.

13. The method of claim 10, further comprising the step of masking a diffusion with the vertical gate to form a source region of the semiconductor device.

14. The method of claim 10, further comprising the step of doping the semiconductor substrate to form a drain region of the semiconductor device at the horizontal surface.

15. The method of claim 10, wherein the step of etching a first conductive material includes the step of anisotropically etching the first conductive material.

16. The method of claim 15, wherein the step of anisotropically etching includes the step of anisotropically etching polycrystalline silicon.

17. The method of claim 10, wherein the step of etching a dielectric spacer includes the step of anisotropically etching silicon nitride.

18. The method of claim 17, further comprising the step of depositing silicon nitride on surfaces of the semiconductor substrate.

19. A method of making a semiconductor device, comprising the steps of:
    etching a dielectric material to form a dielectric spacer adjacent to a vertical surface of a first semiconductor layer;
    etching a second semiconductor layer to form a gate of the semiconductor device adjacent to the dielectric spacer;
    etching the dielectric spacer to form a gap between the first semiconductor layer and the gate; and
    depositing a conductive material in the gap to electrically connect the first semiconductor layer to the gate.

20. The method of claim 19, further comprising the step of depositing the second semiconductor layer along a vertical surface of the dielectric spacer.

* * * * *